US010256132B2

(12) United States Patent
Strassner et al.

(10) Patent No.: US 10,256,132 B2
(45) Date of Patent: Apr. 9, 2019

(54) RETICLE PROCESSING SYSTEM

(71) Applicant: Varian Semiconductor Equipment Associates, Inc., Gloucester, MA (US)

(72) Inventors: James Strassner, Austin, TX (US); Charles Carlson, Cedar Park, TX (US); Robert Brent Vopat, Austin, TX (US); Jeffrey Blahnik, Volente, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 265 days.

(21) Appl. No.: 15/140,633

(22) Filed: Apr. 28, 2016

(65) Prior Publication Data

US 2017/0315437 A1   Nov. 2, 2017

(51) Int. Cl.
*H01L 21/687* (2006.01)
*H01L 21/67* (2006.01)
*H01L 21/673* (2006.01)
*H01L 21/68* (2006.01)

(52) U.S. Cl.
CPC .. *H01L 21/68785* (2013.01); *H01L 21/67259* (2013.01); *H01L 21/67346* (2013.01); *H01L 21/681* (2013.01); *H01L 21/68707* (2013.01)

(58) Field of Classification Search
CPC .. G03F 7/707; G03F 7/70983; G03F 7/70716; G03F 9/7097; H01L 21/682; H01L 21/6875; H01L 21/68785; H01L 21/68778; H01L 21/67359
See application file for complete search history.

(56) References Cited

U.S. PATENT DOCUMENTS

| 4,624,557 | A | 11/1986 | Winn |
| 6,005,910 | A | 12/1999 | Chiba et al. |
| 6,862,817 | B1 * | 3/2005 | Lenox ............... G03F 7/707 |
| | | | 33/613 |

(Continued)

FOREIGN PATENT DOCUMENTS

KR   20040079536 A  *  9/2004
WO     2015023606 A1    2/2015

OTHER PUBLICATIONS

PCT International Search Report and Written Opinion in PCT/US2017/029585 dated Aug. 3, 2017, 14 pages.

(Continued)

*Primary Examiner* — Glenn F Myers
(74) *Attorney, Agent, or Firm* — Servilla Whitney LLC (57) ABSTRACT

Provided herein are approaches for processing reticle blanks. In one approach, a reticle processing system includes a support assembly having a plate coupled to a frame, and a carrier assembly coupled to the support assembly. In one approach, the carrier assembly includes a carrier base coupled to the plate, a reticle disposed over the carrier base, and a carrier shield disposed over the reticle, wherein the carrier shield may include a central opening formed therein, allowing for placement and extraction of the reticle. In one approach, when the carrier assembly is placed atop the support assembly, a plurality of pins extend from the plate through corresponding openings in the carrier base, the plurality of pins supporting the carrier assembly so the carrier base, the reticle, and the carrier shield are each independently supported and vertically separated from one another.

14 Claims, 10 Drawing Sheets

(56) References Cited

U.S. PATENT DOCUMENTS

| 7,453,549 B2 * | 11/2008 | Suzuki | G03F 1/66 |
| | | | 355/30 |
| 9,919,863 B2 * | 3/2018 | Lystad | H01L 21/67359 |
| 2003/0058424 A1 | 3/2003 | Ramamoorthy et al. | |
| 2005/0117142 A1 | 6/2005 | Heerens et al. | |

OTHER PUBLICATIONS

PCT International Preliminary Report on Patentability in PCT/US2017/029585 dated Nov. 8, 2018, 11 pages.

* cited by examiner

RETICLE PROCESSING SYSTEM

FIELD OF THE DISCLOSURE

Embodiments of the present disclosure relate generally to lithography reticle blank processing and, more specifically, to a customized support assembly and associated method for processing lithography reticle blanks using the support assembly.

BACKGROUND OF THE DISCLOSURE

Extreme ultraviolet lithography (EUV), also known as soft x-ray projection lithography, has begun to replace deep ultraviolet lithography for the manufacture of 0.13 micron, and smaller, minimum feature size semiconductor devices. EUV systems operate by reflection instead of transmission of light. Through the use of a series of mirrors, or lens elements, and a reflective element, or mask blank, coated with a non-reflective absorber mask pattern, patterned actinic light is reflected onto a resist-coated semiconductor wafer.

Conventional EUV blank processes may include, for example, a 152 mm×152 mm blank reticle being placed into a coating tool to apply various coatings. As configured, the square reticle is sandwiched within a carrier assembly (e.g., a 300 mm carrier assembly) to enable the reticle to be transferred through the coating tool like a 300 mm wafer. The carrier assembly may include a carrier base, the reticle blank, and a carrier shield.

During processing, every time the reticle blank is transported into the coating tool, the elements of the carrier assembly are brought together and separated apart. This process involves multiple lifts and clamps for separating the carrier base and the carrier shield so a reticle can be placed therebetween. The lifts can be extended or retracted to open or close the carrier assembly. However, this approach is undesirable because multiple lifting and clamping components are provided near the reticle, thus increasing the possibility particles are generated. Furthermore, current techniques undesirably place the reticle in an enclosure, as opposed to directly in a clean FI-robot mini environment, use one of the few loadport positions available on the front of the FI, and reduce accuracy placement for the carrier assembly because the FI needs to pick-up the carrier assembly from multiple modules, thus increasing the likelihood of a placement error.

SUMMARY OF THE DISCLOSURE

In view of the foregoing, an advantage of the present disclosure is to provide a customized support assembly including a plate coupled to a frame, the plate including a plurality of pins extending from the plate through corresponding openings in a carrier base of a carrier assembly to individually support and vertically separate the components of the carrier assembly during processing. Moreover, an advantage of the present disclosure is to provide a system and method for assembling and disassembling the carrier assembly to minimize production of harmful particles.

An exemplary reticle processing system in accordance with the present disclosure may include a support assembly having a plate coupled to a frame, and a carrier assembly coupled to the support assembly. The carrier assembly may include a carrier base coupled to the plate, a reticle disposed over the carrier base, and a carrier shield disposed over the reticle, the carrier shield including a central opening for access to the reticle.

An exemplary reticle carrier in accordance with the present disclosure may include a carrier assembly including a carrier base coupled to the plate, a reticle disposed over the carrier base, and a carrier shield disposed over the reticle, the carrier shield including a central opening allowing access to the reticle. The reticle carrier may further include a support assembly including a plate coupled to a frame, and a plurality of pins extending from a top surface of the plate through corresponding openings in the carrier base, the plurality of pins supporting the carrier assembly so the carrier base is vertically separated from the plate by a first gap, the reticle is vertically separated from the carrier base by a second gap, and the carrier shield is vertically separated from the reticle by a third gap.

An exemplary method of processing a reticle blank in accordance with the present disclosure may include providing a carrier assembly including a carrier base, a carrier shield, and a reticle blank. The method may further include depositing the carrier base and the carrier shield atop a support assembly, the support assembly including a plate coupled to a frame. The method may further include depositing a reticle blank within an opening of the carrier shield, and removing the carrier assembly from the support assembly.

The drawings are not necessarily to scale. The drawings are merely representations, not intended to portray specific parameters of the disclosure. Furthermore, the drawings are intended to depict exemplary embodiments of the disclosure, and therefore is not considered as limiting in scope.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Various approaches in accordance with the present disclosure will now be described more fully hereinafter with reference to the accompanying drawings, where embodiments of the methods are shown. The approaches may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts with respect to the geometry and orientation of a component of a device as appearing in the figures. The terminology will include the words specifically mentioned, derivatives thereof, and words of similar meaning and/or significance.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

As stated above, provide herein are approaches for processing reticle blanks. In one approach, a reticle processing system includes a support assembly having a plate coupled to a frame, and a carrier assembly coupled to the support assembly. The reticle processing system described herein may reside in a "clean" laminar flow region of a mini-environment instead of, for example, a stand-alone pod having no laminar flow and occupying one of the loadport positions. In one approach, the carrier assembly includes a carrier base coupled to the plate, a reticle disposed over the carrier base, and a carrier shield disposed over the reticle, wherein the carrier shield has a central opening formed therein, providing ingress/egress for the reticle. In one approach, when the carrier assembly is placed atop the support assembly, a plurality of pins extend from the plate through corresponding openings in the carrier base, the plurality of pins supporting the carrier assembly so the carrier base, the reticle, and the carrier shield are each independently supported and vertically separated from one another.

Figure 1:
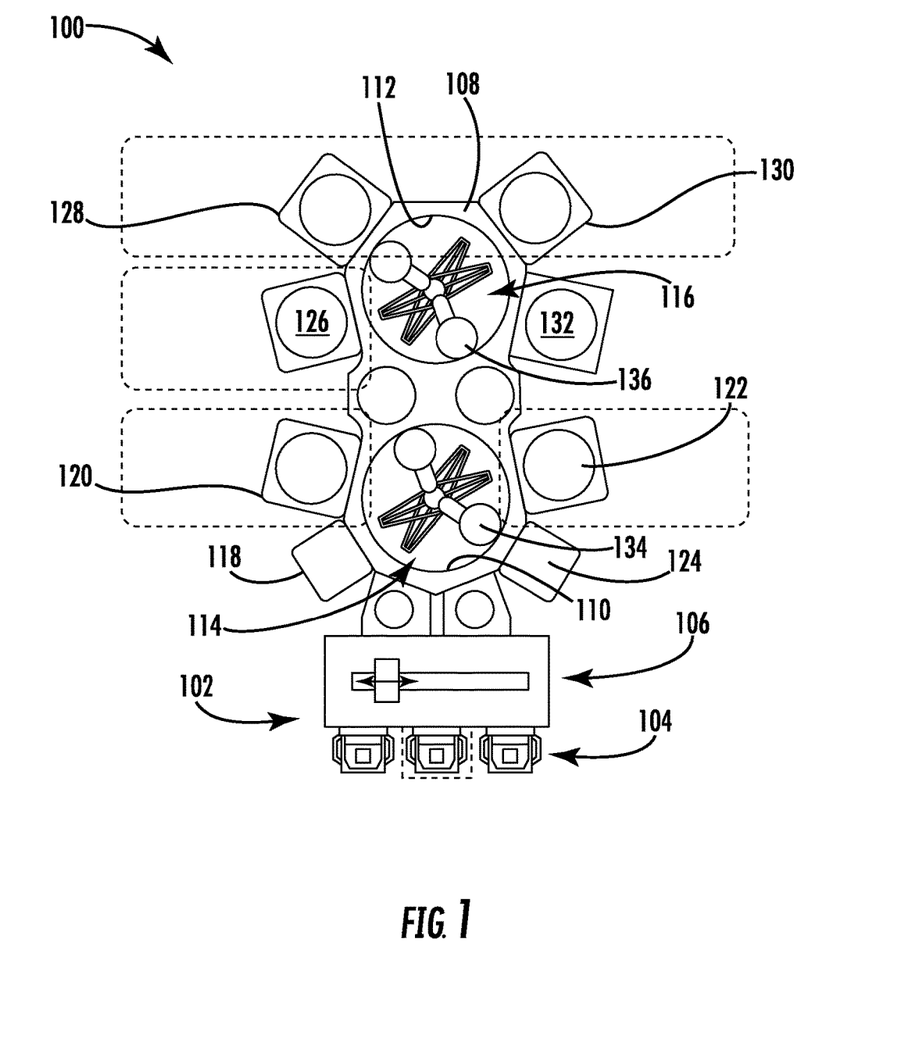
FIG. 1 shows a schematic of an exemplary coating tool in accordance with certain aspects of the present disclosure.

With reference now to the figures, FIG. 1 depicts an EUV mask production system 100. The EUV mask production system 100 may include a mask blank loading and carrier handling system 102 receiving one or more mask blanks 104. An airlock 106 provides access to a wafer handling vacuum chamber 108. In the embodiment shown, the wafer handling vacuum chamber 108 contains two vacuum chambers, e.g., a first vacuum chamber 110 and a second vacuum chamber 112. Within the first vacuum chamber 110 is a first wafer handling system 114, and in the second vacuum chamber 112 is a second wafer handling system 116.

The wafer handling vacuum chamber 108 may have a plurality of ports around its periphery for attachment of various other systems. In this non-limiting embodiment, the first vacuum chamber 110 has a degas system 118, a first physical vapor deposition system 120, a second physical vapor deposition system 122, and a pre-clean system 124. Furthermore, the second vacuum chamber 112 may include a first multi-cathode source 126, a flowable chemical vapor deposition (FCVD) system 128, a cure system 130, and a second multi-cathode source 132 connected to it.

The first wafer handling system 114 is capable of moving wafers, such as a wafer 134, among the airlock 106 and the various systems around the periphery of the first vacuum chamber 110 and through slit valves in a continuous vacuum. The second wafer handling system 116 is capable of moving wafers, such as a wafer 136, around the second vacuum chamber 112, while maintaining the wafers in a continuous vacuum. The integrated EUV mask production system 100 may operate with a reticle processing system described below.

Figure 2:
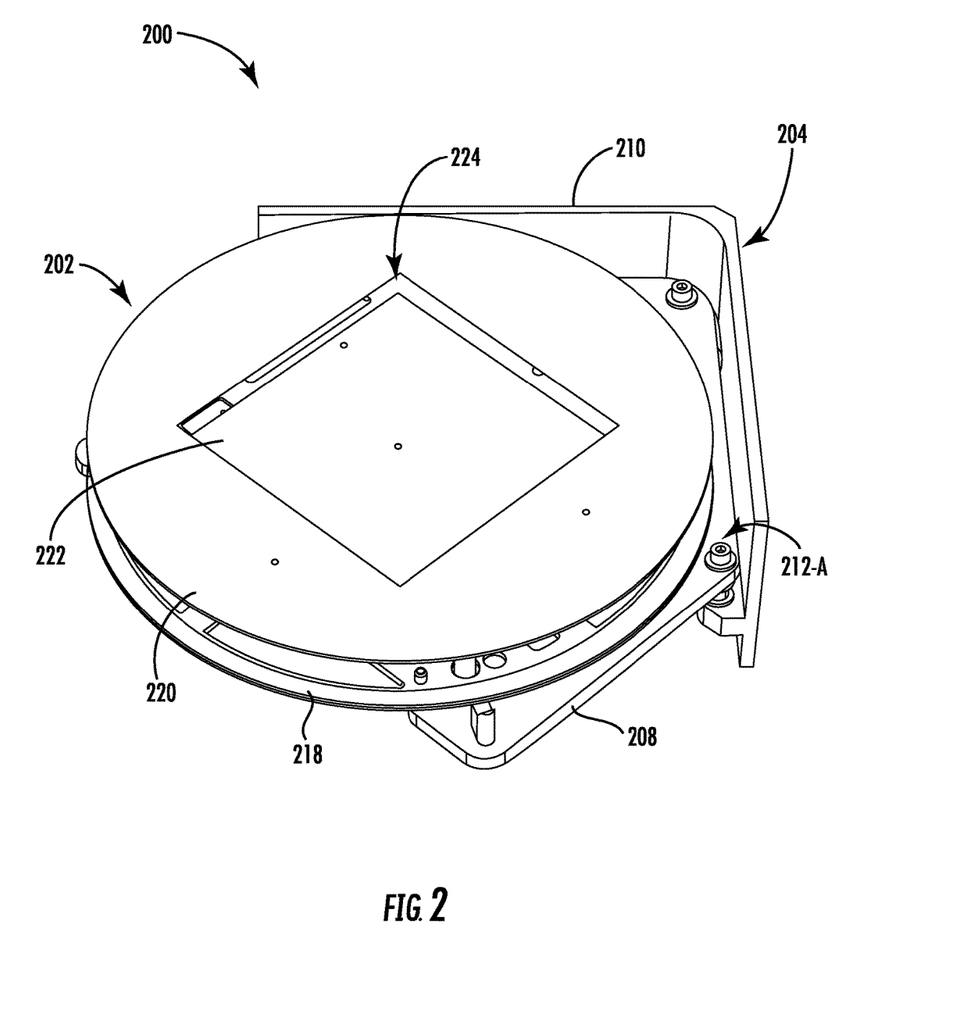
FIG. 2 is a perspective view of a reticle processing system in accordance with certain aspects of the disclosure.
Figure 3:
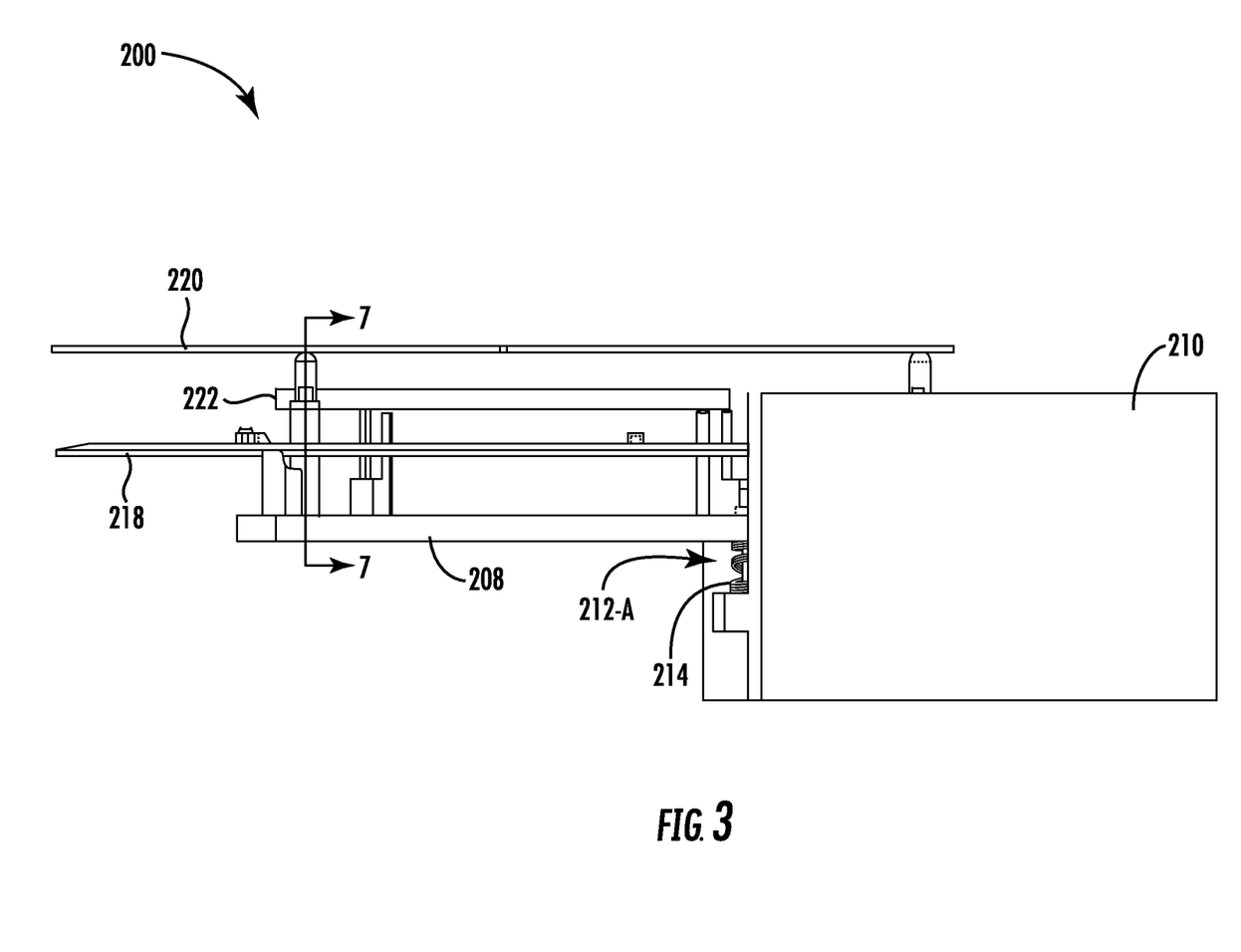
FIG. 3 is a side view of the reticle processing system of FIG. 2 in accordance with certain aspects of the disclosure.
Figure 4:
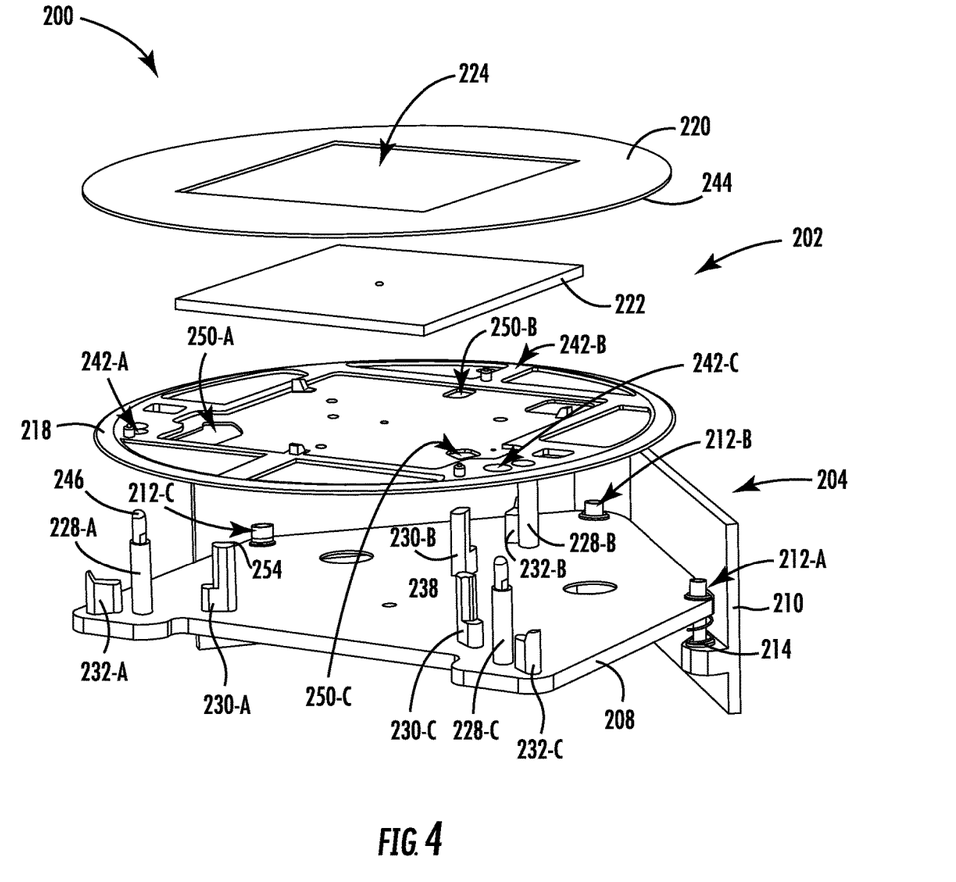
FIG. 4 is an exploded perspective view of the reticle processing system of FIG. 2 in accordance with certain aspects of the disclosure.

Turning now to FIGS. 2-4, a reticle processing system in accordance with the present disclosure will be described in greater detail. As shown, the reticle processing system 200 (hereinafter "system") includes a carrier assembly 202 coupled to and supported by a support assembly 204. In one embodiment, the support assembly 204 includes a plate 208 coupled to a frame 210 extending partially along a periphery of the plate 208. As shown, the plate 208 may be coupled to the frame 210 by a set of fasteners 212A-C extending through openings of the frame 210. Although not limited to any particular type, the fasteners 212A-C may include nuts and bolts extending through the plate 208 and the frame 210, wherein a spring 214 is provided around the bolt to provide flexibility/resiliency to the fasteners 212A-C. As shown, the frame 210 may have an L-shaped configuration, and the plate 208 a hexagonal shape, thus permitting the support assembly 204 to be secured to a corner within a processing chamber. This configuration is non-limiting, as other geometries for the frame 210 and the plate 208 may be possible depending on the specific application and processing environment.

As shown, the carrier assembly 202 includes a carrier base 218 and a carrier shield 220 respectively disposed below and above a reticle blank 222. The carrier shield 220 includes a central opening 224 formed therein to permit access to and ingress/egress of the reticle blank 222 during processing. As shown the central opening 224 of the carrier shield 220 is generally aligned over the reticle blank 222. In one non-limiting approach, the reticle blank 222 is an EUV mask blank having an ultra-low thermal expansion substrate of glass, silicon, or other ultra-low thermal expansion material. The ultra-low thermal expansion materials may include fused silica, fused quartz, calcium fluoride, silicon carbide, silicon oxide-titanium oxide alloy, or other material having a thermal coefficient of expansion within the range of these materials.

Turning now to FIGS. 4-7, the support assembly 204 in accordance with the present disclosure will be described in greater detail. As shown, the plate 208 includes a first set of pins 228A-C, a second set of pins 230A-C, and a third set of pins 232A-C, each extending vertically, or generally vertically, from a top surface 234 of the plate 208. In one embodiment, the second set of pins 230A-C is positioned closer to a center section 238 of the plate 208 than the first set of pins 228A-C, and the first set of pins 228A-C is positioned closer to the center section 238 of the plate 208 than the third set of pins 232A-C. In one non-limiting approach, each of the first, second, and third sets of pins 228A-C, 230A-C, and 232A-C are arranged in a triangular pattern for supporting each component of the carrier assembly 202, while minimizing the number of contact points between the plurality of pins and the carrier assembly. One will appreciate the number and arrangement of support pins is not limited to the embodiment shown.

Figure 5:
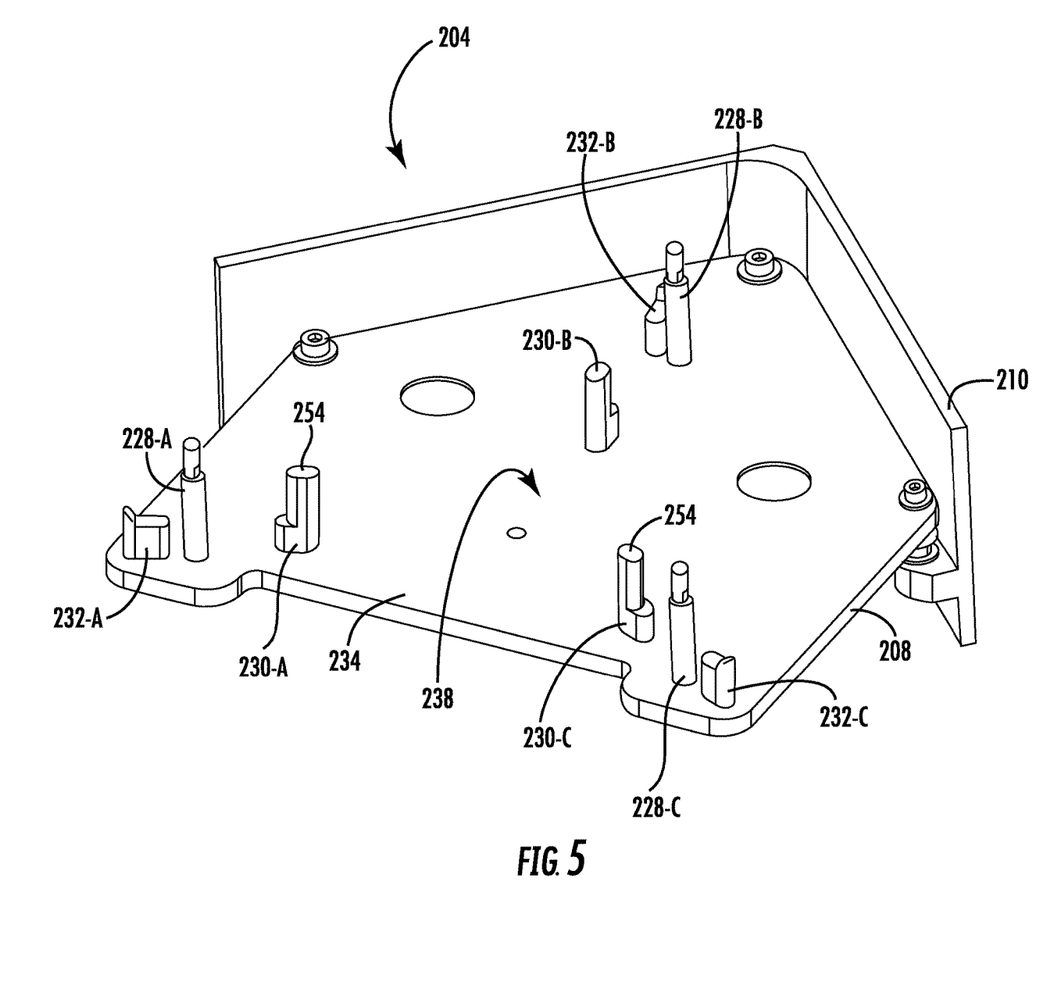
FIG. 5 is a perspective view of a support assembly of the reticle processing system of FIG. 2 in accordance with certain aspects of the disclosure.
Figure 6:
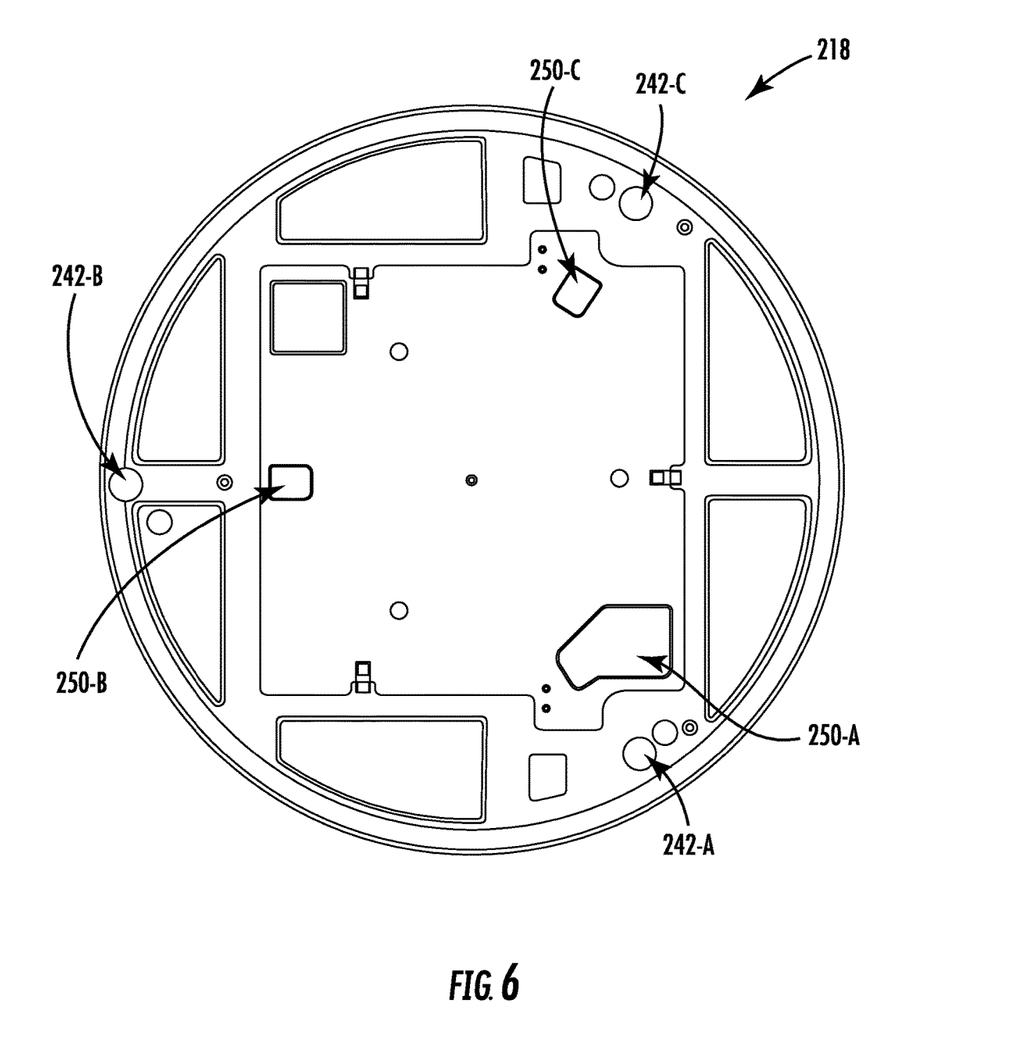
FIG. 6 is a top view of a carrier base of the reticle processing system of FIG. 2 in accordance with certain aspects of the disclosure.
Figure 7:
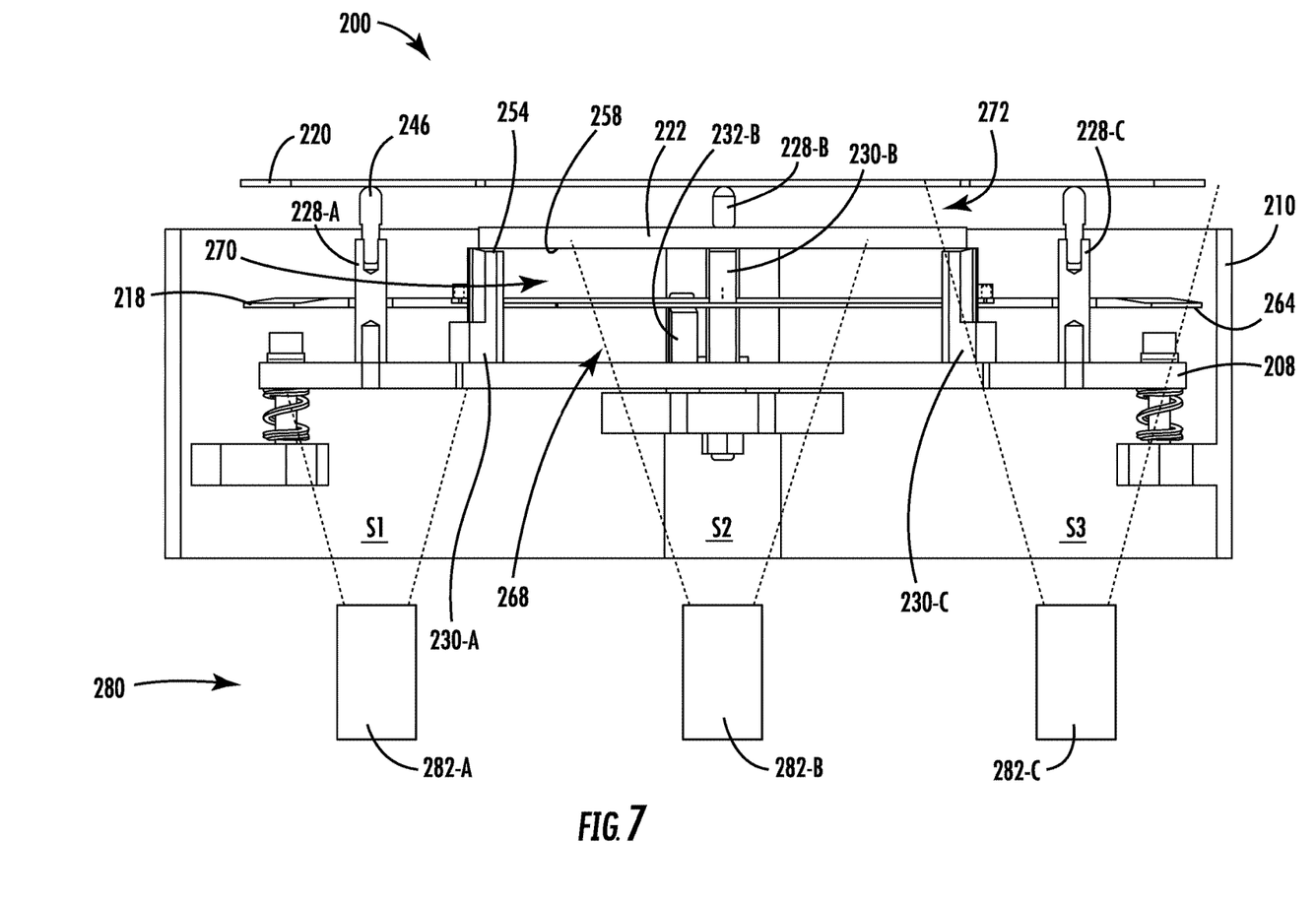
FIG. 7 is a side cross-sectional view of the reticle processing system of FIG. 2 in accordance with certain aspects of the disclosure.

Turning now to FIGS. 5-7, during operation, the support assembly 204 receives the carrier assembly thereupon. More specifically, the carrier base 218 is lowered onto the plate 208 causing the first set of pins 228A-C to extend through a corresponding first set of openings 242A-C within the carrier base 218. As shown, the first set of pins 228A-C generally extend vertically higher than the second and third set of pins 230A-C and 232A-C so as to come into contact with a bottom surface 244 of the carrier shield 220 once assembled. The first set of pins 228A-C support and elevate the carrier shield 220 over the reticle 222. In one embodiment, the first set of pins 228A-C each include a domed upper tip 246 for minimally engaging the bottom surface 244 of the carrier shield 220.

Furthermore, as the carrier base 218 is lowered on the plate 208, the second set of pins 230A-C extend through a corresponding second set of openings 250A-C within the carrier base and engage the reticle 222. As shown, the second set of pins 230A-C generally extend vertically higher than the third set of pins 232A-C, yet not as high as the first set of pins 228A-C. Each of the second set of pins 230A-C includes an upper face 254 engaging a bottom surface 258 of the reticle 222 to support the reticle over the carrier base 218. In one embodiment, the upper face 254 slopes downward towards the center section 238 of the plate 208.

Figure 8A:
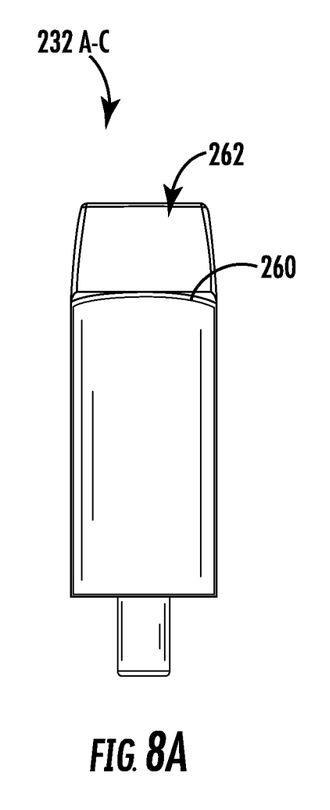
FIGS. 8A-8B are front and side views, respectively, of a support pin used with the reticle processing system of FIG. 2 in accordance with certain aspects of the disclosure.
Figure 8B:
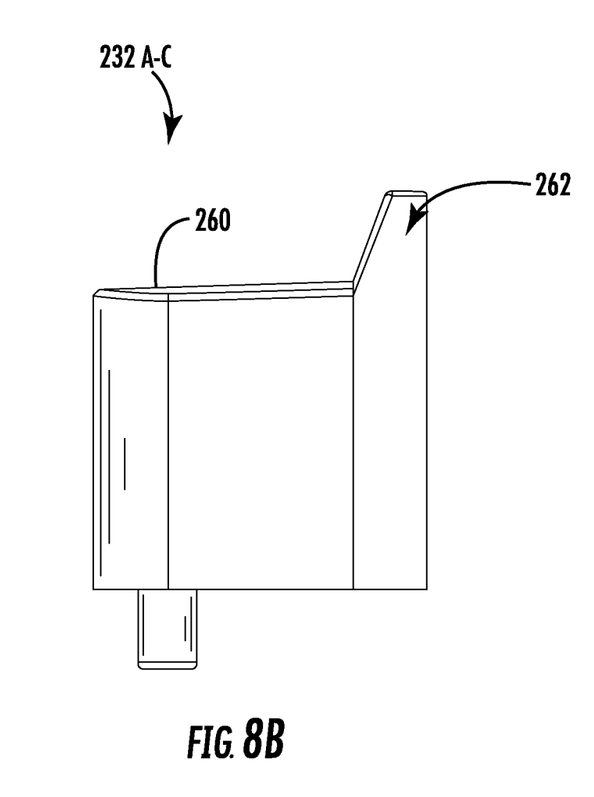

Meanwhile, the third set of pins 232A-C engage the carrier base 218 along a perimeter thereof, to support the carrier base 218 over the plate 208. More specifically, as shown in FIGS. 8A-8B, the third set of pins 232A-C each include an upper seating surface 260 coupled to a backing section 262, for engaging a bottom surface 264 (FIG. 7) of the carrier base 218. The backing section 262 is configured to limit lateral movement of the carrier base 218 once the carrier base 218 is positioned upon the upper seating surface 260. Furthermore, the domed/convex profile of the upper seating surface 260 may reduce surface area contact between the carrier base 218 and the third set of pins 232A-C, thus minimizing particle generation. The downward slope of the upper seating surface 260 towards the center section 238 of the plate 208 may enhance stability and placement accuracy of the carrier plate 218.

Turning again to FIG. 7, the plurality of pins 228A-C, 230A-C, and 232A-C support the carrier assembly 202 so the carrier base 218, the reticle 222, and the carrier shield 220 are each independently supported and vertically separated from one another. During use, when the carrier assembly 202 is placed on the support assembly 204, the components of the carrier assembly are not in direct contact with one another. Specifically, the plurality of pins support the components of the carrier assembly 202 in a way so the carrier base 218 is vertically separated from the plate 208 by a first gap 268, the reticle 222 is vertically separated from the carrier base 218 by a second gap 270, and the carrier shield 220 is separated from the reticle 222 by a third gap 272. The placement and relative heights of the plurality of pins 228A-C, 230A-C, and 232A-C, as well as the corresponding openings through the carrier base 218, enable the demonstrated separation between components of the carrier assembly 202 when positioned atop the support assembly 204.

In some embodiments, as further shown in FIG. 7, the system 200 may include a sensor system 280 for aligning the carrier assembly 202 to the support assembly 204. For example, one or more sensors 282A-C are used to verify whether each of the carrier assembly components (e.g., the carrier shield 220, the reticle 222, or the carrier base 218) are correctly "in-position" on the support assembly 204. This also prevents a user from inadvertently placing the carrier assembly 202 or reticle 222 on the support assembly 204 if one is already in position.

In one non-limiting embodiment, a first sensor 282-A monitors a first scan area S1 for detecting a presence and placement of the carrier base 218, a second sensor 282-B monitors a second scan area S2 for detecting a presence and placement of the reticle 222, and a third sensor 282-C monitors a third scan area S3 for detecting a presence and placement of the carrier shield 220. The sensors may transmit an output/feedback to a processor (not shown) of the sensor system 280 for subsequent analysis/processing.

During operation, the sensor system 280 is used in conjunction with a robot (not shown), such as a factory interface (FI) robot, to accurately place the carrier assembly 202, including the reticle 222, onto the carrier assembly 202, where the carrier assembly 202 can be assembled or disassembled. Furthermore, the sensor system 280 is used to verify the carrier assembly 202, including the reticle 222, are assembled correctly prior to being delivered to the loadlock. Advantageously, the robot is the sole moving component, ensuring the system 200 is not subject to unnecessary lifts or multiple robots, thus minimizing positional errors. For example, the vertical pick up and drop off trajectory of the robot is virtually identical, unlike when multiple, different lifts are employed.

Figure 9:
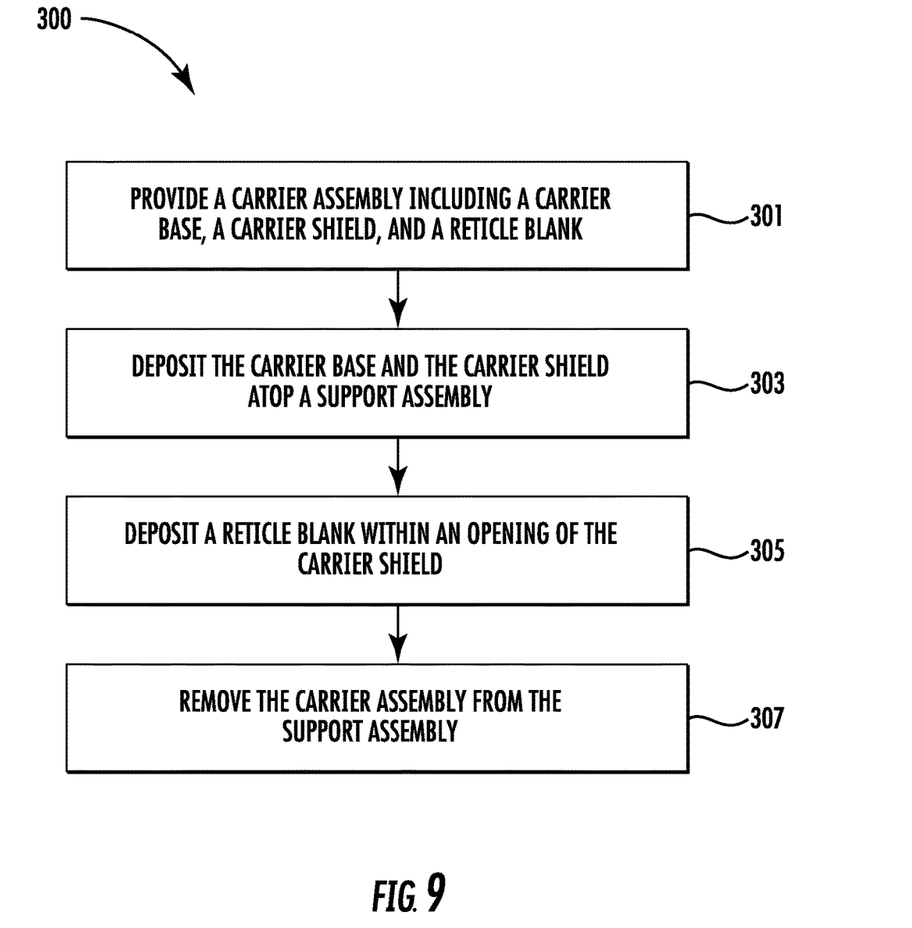
FIG. 9 is a flowchart illustrating an exemplary method for processing a reticle according to the present disclosure.
Figure 10:
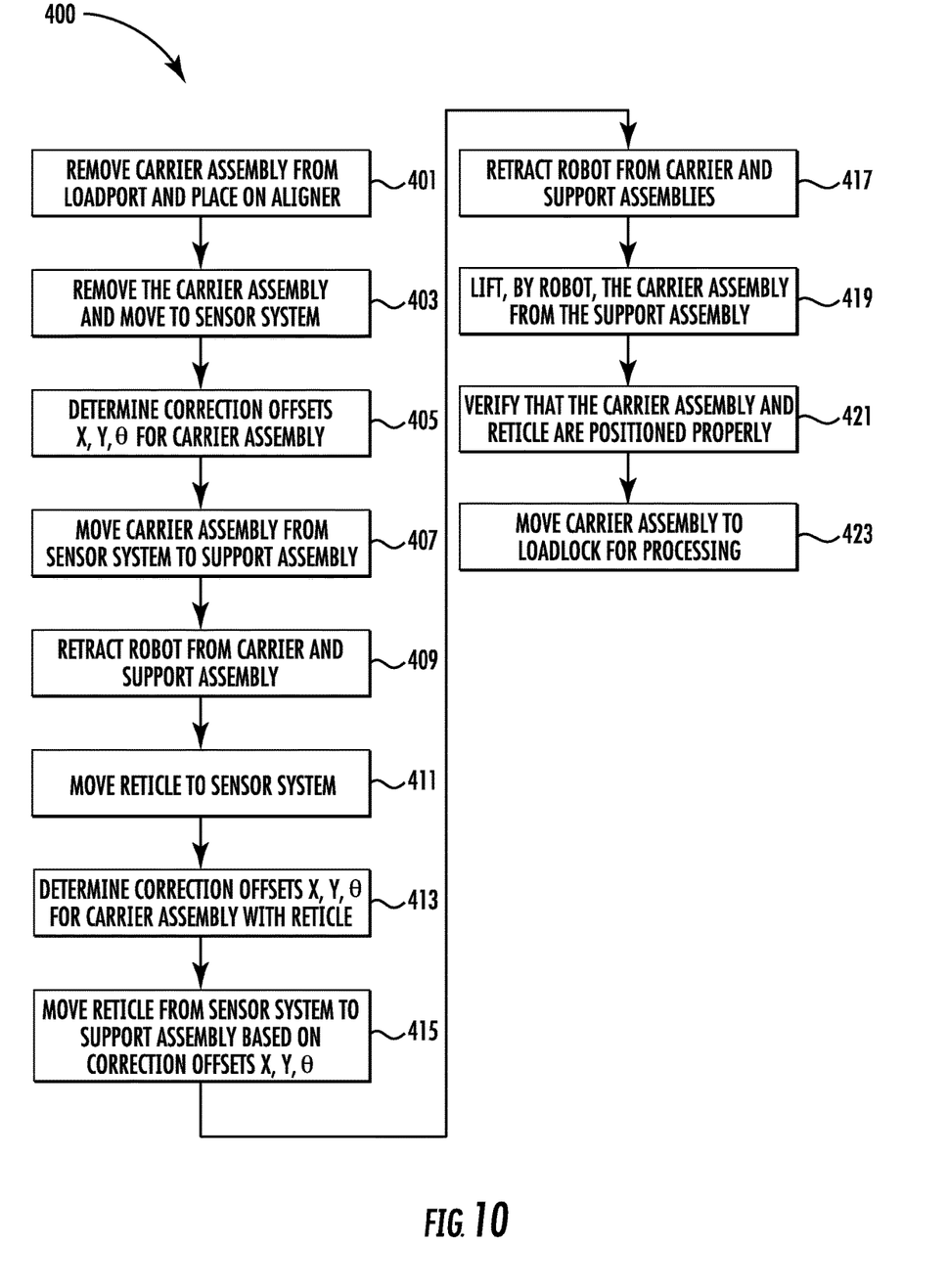
FIG. 10 is a flowchart illustrating an exemplary method for operating the reticle processing system of FIG. 2 according to the present disclosure.

Turning now to FIGS. 9-10, respectively depicted are flow diagrams of methods for processing a reticle blank in accordance with certain aspects of the present disclosure. In some embodiments, the methods may be implemented or instructed in part using a computer system. As such, the methods of FIGS. 9-10 may illustrate the functionality and/or operation of possible implementations of systems, methods, and computer program products according to various embodiments of the present disclosure. In this regard, the blocks in the flowchart may represent a module, segment, or portion of code, comprising one or more executable instructions for implementing the specified logical function(s). As also noted, in some alternative implementations, the functions noted in the blocks might occur out of the order depicted in the figures. For example, two blocks shown in succession may, in fact, be executed concurrently. As also noted, the blocks of the methods 300, 400 can be implemented by special purpose hardware-based systems for performing the specified functions or acts, or combinations of special purpose hardware and computer instructions.

In one embodiment, as shown in FIG. 9, the method 300 may include providing a carrier assembly including a carrier base, a carrier shield, and a reticle blank, as shown at block 301. The method 300 may further include depositing the carrier base and the carrier shield atop a support assembly, as shown at block 303. In some embodiments, the support assembly includes a plate coupled to a frame. In some embodiments, the method 300 at block 303 includes depositing the carrier assembly atop a plurality of pins extending from a top surface of the plate, wherein the plurality of pins support the carrier assembly so the carrier base is vertically separated from the plate by a first gap, the reticle blank is vertically separated from the carrier base by a second gap, and the carrier shield is vertically separated from the reticle by a third gap.

In some embodiments, the method 300 at block 303 may further include identifying a position of the carrier assembly using a sensor system, and depositing the carrier assembly atop the support assembly according to the identified position of the carrier assembly.

In some embodiments, the method 300 at block 303 may further include providing a first set of pins extending from a top surface of the plate through a first set of openings in the carrier base, the first set of pins in contact with a bottom surface of the carrier shield, and providing a second set of pins extending from the top surface of the plate through a second set of openings in the carrier base. The method 300 at block 303 further includes the second set of pins supporting the reticle over the carrier base, wherein the second set of pins is positioned closer to a center section of the plate than the first set of pins. The method 300 at block 303 further includes providing a third set of pins extending from the top surface of the plate, wherein the third set of pins is in contact with the carrier base to support the carrier base over the plate, and wherein the first set of pins is positioned closer to the center section of the plate than the third set of pins. The method 300 at block 303 may further include placing the carrier base atop an upper shelf surface of the third set of pins, wherein the upper shelf surface has a domed profile sloping downward towards a center of the support assembly.

The method 300 further includes depositing the reticle blank within an opening of the carrier shield, as shown at block 305. In some embodiments, the reticle blank is deposited atop the second set of pins extending from the plate.

The method 300 further includes removing the carrier assembly from the support assembly, as shown at block 307. In some embodiments, a robot is positioned within the first gap formed between plate and the carrier base, and the carrier assembly is then lifted upwards from the support assembly, thus causing the carrier base, the carrier shield, and the reticle blank to compress and engage one another. The robot may then transport the carrier assembly for further processing.

Turning now to FIG. 10, depicted is another flow diagram of a method 400 for operating a reticle blank processing system in accordance with certain aspects of the present disclosure. At block 401, a robot (e.g., an FI robot) removes carrier assembly from the loadport and places the carrier assembly on an aligner, where the carrier assembly is then notch aligned. At block 403, the robot removes the aligned carrier assembly from the aligner and moves it to the sensor system. At block 405, while the carrier assembly is still on the robot blade, the sensor system determines "correction offsets" for X, Y, and θ between the measured carrier assembly to a theoretical calibrated center X, Y, and θ of the carrier assembly.

At block 407, the robot moves the carrier assembly from the sensor system to the support assembly. At block 409, the robot retracts from the support assembly when the carrier assembly is in an expanded configuration atop each of the plurality of pins. At block 411, the reticle is moved to the sensor system for measurement. At block 413, while still on the robot blade, the sensor system determines correction offsets for X, Y, and θ between the measured carrier assembly to a theoretical calibrated center X, Y, and θ of the carrier assembly with the reticle. The sensor system also determines whether the reticle is up/down, as well as its orientation.

At block 415, the robot moves the reticle from the sensor system to the support assembly utilizing the correction offsets for X, Y, and θ. At block 417, the robot then retracts from the support assembly, leaving the reticle on the second plurality of pins of the carrier assembly. As configured, the reticle is suspended between the carrier base and the carrier shield of the carrier assembly.

Next, at block 419, the robot moves beneath the carrier base and begins to lift, picking up the carrier base, the reticle, and then the carrier shield. As the robot moves upward, the carrier assembly collapses, causing the carrier base, the reticle, and the carrier shield to engage one another. For example, a top surface of the carrier base comes into contact with a bottom surface of the reticle, and the reticle moves upwards within an opening of the carrier shield. At block 421, the sensor system verifies the carrier assembly and the reticle are positioned within specified tolerance specifications. Once verified, at block 423, the carrier assembly is moved to the loadlock (e.g., a single wafer load lock (SWLL)).

A first advantage of the disclosure includes the elimination of multiple lifting and clamping mechanisms near the reticle, thus reducing generation of particles. A second advantage of the disclosure includes the reticle being placed directly in a clean FI mini environment. A third advantage is the elimination of at least one placement process, thus increasing accuracy of placement for the carrier assembly. A fourth advantage of the disclosure is increased accuracy due to the additional verification process after the robot picks up the carrier assembly.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

The invention claimed is:

1. A reticle processing system comprising:
   a support assembly including a plate coupled to a frame; and
   a carrier assembly coupled to the support assembly, the carrier assembly comprising:
   a carrier base coupled to the plate;
   a reticle disposed over the carrier base;
   a carrier shield disposed over the reticle, the carrier shield including a central opening allowing access to the reticle; and
   a plurality of pins which receives executable instructions, wherein the plurality of pins receives the executable instructions to independently support and vertically separate the carrier base, the reticle and the carrier shield from one another and maintain the carrier assembly in an expanded configuration until the carrier assembly is lifted upwardly, causing the carrier base, the carrier shield and the reticle blank to compress and engage each other.

2. The reticle processing system of claim 1, the plurality of pins further comprising a first set of pins extending from a top surface of the plate through a first set of openings in the carrier base, the first set of pins in contact with a bottom surface of the carrier shield to support the carrier shield over the reticle.

3. The reticle processing system of claim 2, the plurality of pins further comprising a second set of pins extending from the top surface of the plate through a second set of openings in the carrier base, the second set of pins in contact with the reticle to support the reticle over the carrier base.

4. The reticle processing system of claim 2, the plurality of pins further comprising a third set of pins extending from the top surface of the plate, the third set of pins supporting the carrier base over the plate.

5. The reticle processing system of claim 4, wherein each of the third set of pins includes an upper seating surface in contact with a bottom surface of the carrier base.

6. The reticle processing system of claim 5, wherein the upper seating surface of the third set of pins is convex and slopes downward towards a center section of the plate.

7. The reticle processing system of claim 1, wherein the carrier base is vertically separated from the plate by a first gap, the reticle is vertically separated from the carrier base by a second gap, and the carrier shield is vertically separated from the reticle by a third gap.

8. The reticle processing system of claim 1, further comprising a sensor system which aligns the carrier assembly to the support assembly and the sensor system comprises a first sensor that monitors a first scan area to detect a presence and placement of the carrier base, a second sensor that monitors a second scan area to detect a presence and placement of the reticle and a third sensor that monitors a third scan area to detect a presence and a placement of the carrier shield.

9. The reticle processing system of claim 1, wherein the central opening of the carrier shield is aligned over the reticle.

10. A reticle carrier, comprising:
a carrier assembly comprising:
a carrier base disposed over a carrier plate of a support assembly;
a reticle disposed over the carrier base; and
a carrier shield disposed over the reticle, the carrier shield including a central opening aligned over the reticle; and
the support assembly comprising:
a plurality of pins extending from a top surface of the plate through corresponding openings in the carrier base, the plurality of pins supporting the carrier assembly and receiving executable instructions so the carrier base is vertically separated from the plate by a first gap, the reticle is vertically separated from the carrier base by a second gap, and the carrier shield is vertically separated from the reticle by a third gap, wherein the plurality of pins receives the executable instructions to maintain the carrier assembly in an expanded configuration until the carrier assembly is lifted upwardly, causing the carrier base, the carrier shield and the reticle blank to compress and engage each other.

11. The reticle carrier of claim 10, the plurality of pins further comprising a first set of pins of the plurality of pins, the first set of pins extending from a top surface of the plate through a first set of the corresponding openings in the carrier base, the first set of pins in contact with a bottom surface of the carrier shield.

12. The reticle carrier of claim 11, the plurality of pins further comprising a second set of pins of the plurality of pins, the second set of pins extending from the top surface of the plate through a second set of the corresponding openings in the carrier base, wherein the second set of pins is in contact with the reticle to support the reticle over the carrier base, and wherein the second set of pins is positioned closer to a center section of the plate than the first set of pins.

13. The reticle carrier of claim 12, the plurality of pins further comprising a third set of pins of the plurality of pins, the third set of pins extending from the top surface of the plate, wherein the third set of pins is in contact with the carrier base to support the carrier base over the plate, and wherein the first set of pins is positioned closer to the center section of the plate than the third set of pins.

14. The reticle carrier of claim 13, wherein each of the third set of pins includes an upper seating surface in contact with a bottom surface of the carrier base, and wherein the upper seating surface is convex and slopes downward towards the center section of the plate.

* * * * *

UNITED STATES PATENT AND TRADEMARK OFFICE
CERTIFICATE OF CORRECTION

PATENT NO. : 10,256,132 B2
APPLICATION NO. : 15/140633
DATED : April 9, 2019
INVENTOR(S) : James Strassner et al.

Page 1 of 1

It is certified that error appears in the above-identified patent and that said Letters Patent is hereby corrected as shown below:

In the Specification

In Column 6, Line 6, after "area", replace "51" with "S1".

Signed and Sealed this
Eleventh Day of June, 2019

Andrei Iancu
*Director of the United States Patent and Trademark Office*